US009305622B1

(12) United States Patent
Jeter (10) Patent No.: US 9,305,622 B1
(45) Date of Patent: Apr. 5, 2016

(54) DATA STROBE TO DATA DELAY CALIBRATION

(71) Applicant: Apple Inc., Cupertino, CA (US)

(72) Inventor: Robert E. Jeter, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/604,546

(22) Filed: Jan. 23, 2015

(51) Int. Cl.
*G11C 7/22* (2006.01)

(52) U.S. Cl.
CPC . *G11C 7/22* (2013.01); *G11C 7/222* (2013.01)

(58) Field of Classification Search
CPC .................................. G11C 7/22; G11C 7/222
USPC ............................................. 365/193, 189.05
See application file for complete search history.

(56) References Cited

U.S. PATENT DOCUMENTS

| 6,085,345 | A  | * | 7/2000  | Taylor ................ G01R 31/3016 327/2 |
| 6,316,980 | B1 | * | 11/2001 | Vogt .................... G11C 7/1051 327/241 |
| 7,088,159 | B2 |   | 8/2006  | Kwak et al. |
| 7,586,351 | B2 | * | 9/2009  | Aoki .................... G11C 7/1051 327/263 |
| 8,423,813 | B2 | * | 4/2013  | Huang .................... G06F 5/06 400/503 |
| 8,824,224 | B2 |   | 9/2014  | Ware et al. |
| 8,878,586 | B2 |   | 11/2014 | Kwak et al. |
| 2003/0236641 | A1 | * | 12/2003 | Liou .................... G11C 7/1006 702/89 |
| 2008/0048747 | A1 | * | 2/2008  | Iizuka .................. G11C 7/1066 327/261 |
| 2011/0211404 | A1 | * | 9/2011  | Raghunathan ....... G11C 7/1066 365/193 |
| 2013/0094310 | A1 | * | 4/2013  | Best .......................... G06F 1/10 365/193 |
| 2014/0003550 | A1 |   | 1/2014  | Krishnamoorthy et al. |
| 2014/0233333 | A1 | * | 8/2014  | Best .......................... G06F 1/10 365/193 |
| 2014/0266320 | A1 |   | 9/2014  | Conrow et al. |
| 2014/0281666 | A1 | * | 9/2014  | Gopalan ............. G06F 11/0763 714/3 |
| 2015/0145581 | A1 | * | 5/2015  | Palmer .................. H03K 5/131 327/262 |

* cited by examiner

*Primary Examiner* — Michael Tran
(74) *Attorney, Agent, or Firm* — Meyertons, Hood, Kivlin, Kowert & Goetzel, P.C.; Erik A. Heter (57) ABSTRACT

A method and apparatus for performing a data strobe-to-data delay calibration is disclosed. In one embodiment, a data strobe signal, along with data, is conveyed from a memory controller to a memory. An initial delay calibration procedure may be performed to align the data and the data strobe signals at the memory, with subsequent calibrations performed there between in order to compensate for changes due to various factors such as voltage and temperature. In the calibrations performed between the delay calibration procedures, a calibrated delay value may be multiplied by a first scaling factor and a second scaling factor to generate a scaled code. A DLL configured to convey the data strobe signal may then be programmed based on this code.

20 Claims, 6 Drawing Sheets

DATA STROBE TO DATA DELAY CALIBRATION

BACKGROUND

1. Technical Field

This disclosure is directed to computer systems, and more particularly, to memory subsystems in which data transfers are synchronized to a clock signal.

2. Description of the Related Art

In many memory systems, such as various double data rate (DDR) systems, a clock signal known as a data strobe is transmitted along with data. Data received at, e.g., the memory, may be synchronized to the data strobe.

As clock speeds increase, inherent delays between the data strobe and the data may become problematic. Such delays may be exacerbated by voltage and temperature variations. In some cases, memory manufacturers may match internal delays between the data strobe and data signals as a method of compensation. In other cases, calibrations may be performed to align the data strobe to the data signals.

SUMMARY

A method and apparatus for performing a data strobe-to-data delay calibration is disclosed. In one embodiment, a data strobe signal, along with data, is conveyed from a memory controller to a memory. An initial delay calibration procedure may be performed to align the data strobe signal at the center of the data as received inside the memory, with subsequent calibrations performed there between in order to compensate for changes due to various factors such as voltage and temperature. In the calibrations performed between the delay calibration procedure, a calibrated delay value may be multiplied by a first scaling factor and a second scaling factor to generate a scaled code. A slave delay locked loop (DLL) configured to convey the data strobe signal may then be programmed based on this code.

In one embodiment, the calibrated delay value may be stored in a register in the memory controller. A reference code for a master DLL may be determined based on the calibrated delay value, with a phase shift (e.g., 90°) added thereto. Between calibrations of the data strobe delay, the master DLL (MDLL) may undergo calibration procedures to determine the amount of delay to provide in order to maintain a value corresponding to the calibrated delay, with a current code being generated. A first divider may divide the current code by the reference code (for the MDLL) to generate a first scaling factor. Subsequently, the value corresponding to the calibrated delay may be multiplied by the first scaling factor in order to generate a first scaled code. The memory may provide a reference count value (corresponding to the calibrated delay) responsive to performance of the delay calibration procedure, and a current count value for calibrations performed between the delay calibration procedures. A second divide may divide the current count value by the reference count value to generate a second scaling factor. The second scaling factor may be multiplied by the first scaled code in order to generate a second scaled code. The slave DLL may then be programmed based on the second scaled code.

BRIEF DESCRIPTION OF THE DRAWINGS

The following detailed description makes reference to the accompanying drawings, which are now briefly described.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Figure 1:
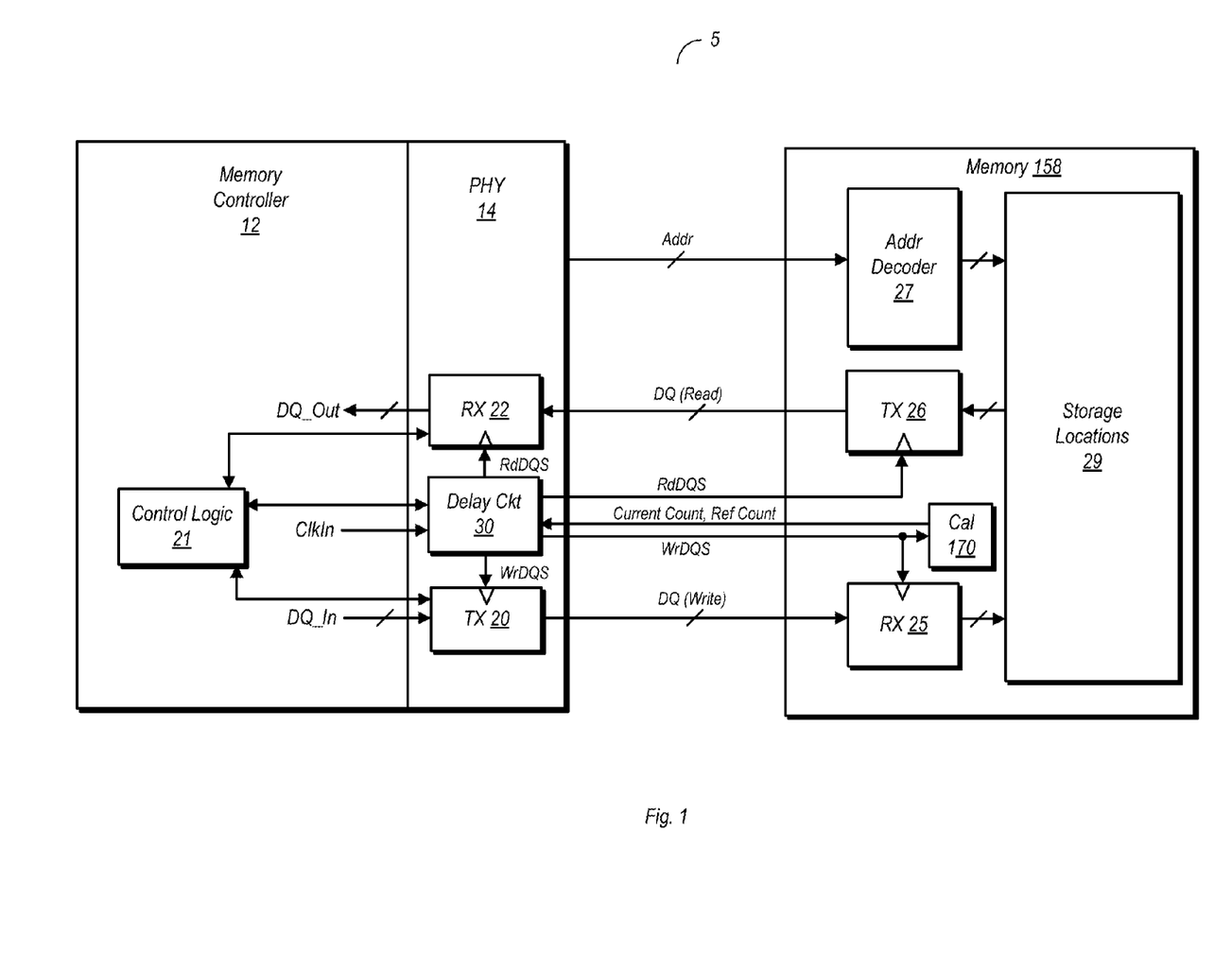
FIG. 1 is a block diagram of one embodiment of a memory subsystem.

Turning now to FIG. 1, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes control logic 21, which may perform various functions, including conducting various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe (adDQS') and a write data strobe ('WrDQS'). For example, one embodiment of delay circuit 30 may include a multiple delay locked loops (DLLs), including one configured to output the read data strobe and one to output the write data strobe. In some embodiments, DLLs that output data strobe signals may be slave DLLs that receive an incoming clock signal from a corresponding master DLL. The delays of the respective DLLs may be set by various mechanisms, such as by codes programmed into the various DLLs. These codes may be determined during one or more calibration procedures that are performed to align the data strobe signals.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Various, calibration procedures may be performed at certain times during operation of memory controller 12 in order to optimize the point in time at which the data strobe signals sample data. The calibration procedures may be conducted under the control of control logic 21, and involved performing a number of reads of from memory along with adjustments of an amount of delay applied to the data strobe signal being calibrated. Various embodiments of calibration procedures are now discussed in further detail. Different calibration procedures may be performed at different intervals. For example, one calibration procedure may be performed at a first periodicity to determine a delay to be applied to a DLL. Another calibration may be performed at a second periodicity greater than the first (i.e., more often) on the memory side to track voltage and temperature changes there. A third calibration may be performed at a periodicity greater than the first (and greater than the second) on the memory controller side to ensure that the desired delay of the data strobe is maintained between those calibrations performed at the first periodicity. The calibrations that are performed entirely on the memory side may be performed by calibration circuit 170, which may convey information back to delay circuit 30. This calibration procedure is discussed in further detail below.

It is noted that while the calibration procedures are discussed herein within the context of a memory subsystem and transfer of data between the memory and a memory controller, the disclosure is not limited as such. In contrast, various embodiments of the calibration methods discussed herein may be utilized with a number of systems in which data transfers of a number of bits are synchronized to a particular clock signal.

Figure 2:
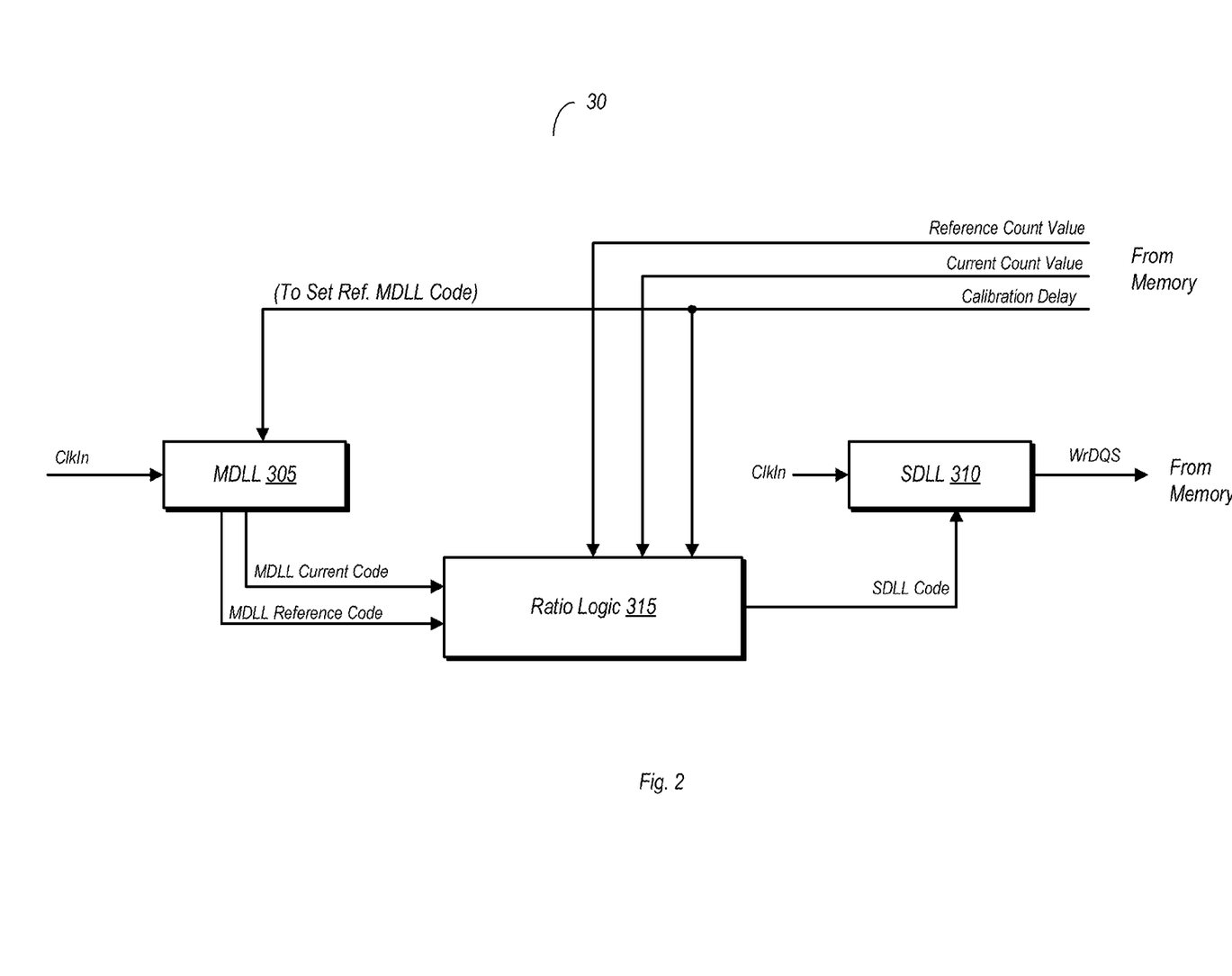
FIG. 2 is a block diagram of one embodiment of a delay circuit in a memory subsystem.

Turning now to FIG. 2, a block diagram illustrating part of one embodiment of a delay circuit is shown. In particular, the portions of delay circuit 30 illustrated here are directed to setting and maintaining a calibrated delay of the write data strobe signal, WrDQS. The illustrated portion of delay circuit 30 includes a master DLL (MDLL) 305, a slave DLL (SDLL) 310, and ratio logic 315. MDLL 305 in the embodiment shown is coupled to receive a clock signal, ClkIn, which provides the basis for the write data strobe signal. During operation, MDLL 305 acts to maintain a delay of the data strobe through adjustments to the MDLL code. Ratio logic 315, using various information, may apply scaling factors that are used to generate a code to program SDLL 310 in order to maintain the calibrated delay of the data strobe signal while compensating for voltage and temperature changes that may occur on both the memory controller and memory sides of the interface.

Ratio logic 315 in the embodiment shown is configured to determine the SDLL code based on a number of different pieces of information. From MDLL 305, ratio logic 315 may receive a current MDLL code and a reference MDLL code. The reference code may be updated responsive to a calibration used to determine the delay to be applied to the write data strobe signal. In between these calibrations, MDLL 305 may undergo a number of calibrations to determine a number of delay steps required to maintain the calibrated delay of the data strobe. In one embodiments, MDLL 305 may be configured to periodically perform self-calibrations to determine the number of delay steps and generate a phase-shifted code (e.g., 90°). For example, upon a calibration of the data strobe, a self-calibration of MDLL 305 may determine that 50 delay steps are required to set the delay of the data strobe (this value is reflected in the reference MDLL code). During a subsequent self-calibration, MDLL 305 may determine that 55 delay steps are required to maintain the calibrated delay of the data strobe (i.e. a 10% increase in a number of steps). The increased value may be reflected in the current MDLL code. Both of these pieces of information may be forwarded to ratio logic 315 in order to calculate a scaling factor based on these values. Performing the periodic self-calibrations of MDLL 305 between data strobe delay calibrations may allow for the tracking of voltage and temperature changes in the memory controller as may be necessary to maintain the data strobe delay at the calibrated value.

While MDLL 305 is discussed above as being configured to perform self-calibration, the various apparatus embodiments discussed herein are not limited to the same. Embodiments in which an MDLL 305 is calibrated using other mechanisms are possible and contemplated within the spirit and scope of this disclosure.

Figure 4:
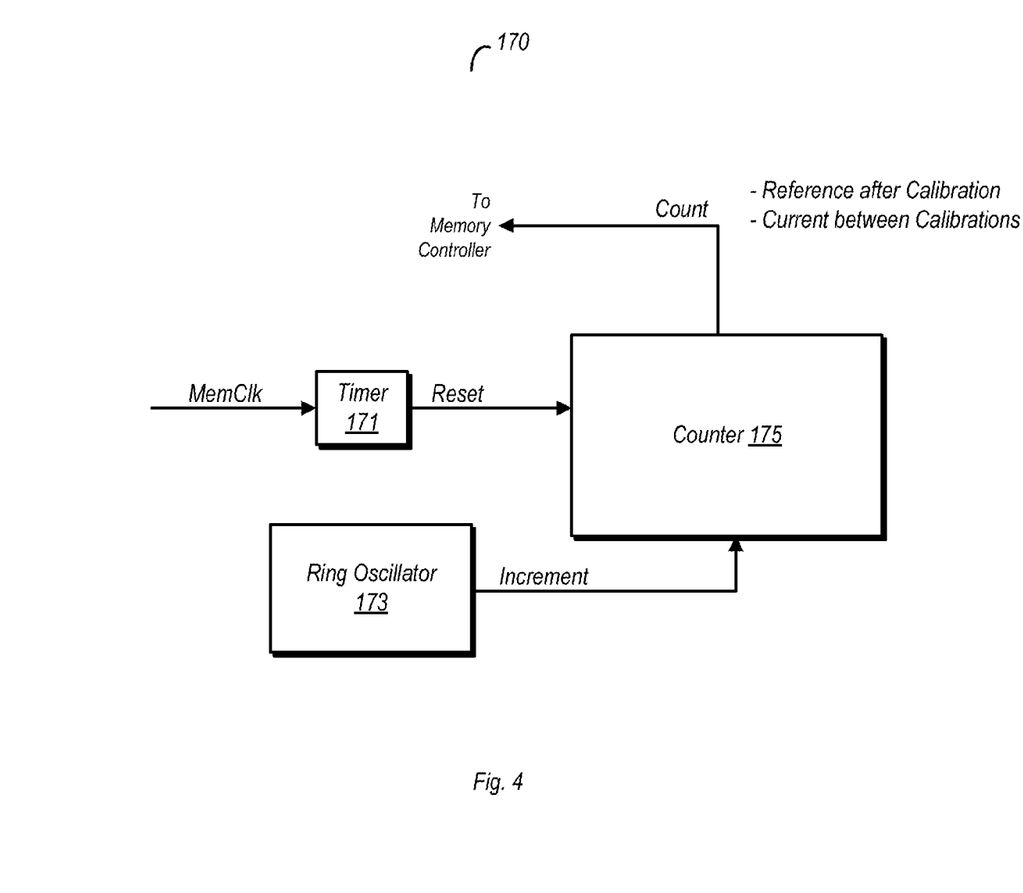
FIG. 4 is a block diagram illustrating one embodiment of a delay calibration circuit on a memory.

Voltage and temperature changes in the memory itself may be computed using a current count value and a reference count value. The count values may be received from the calibration circuit 170 on memory 158. Turning briefly to FIG. 4, one embodiment of a calibration circuit 170 is shown.

As shown here, calibration circuit 170 includes a timer 171, a ring oscillator 173, and a counter 175. Timer 171 in the embodiment shown is configured to operate for a predetermined amount of time and to assert a reset signal to counter 175 after this time has elapsed. In one embodiment, the predetermined amount of time may be defined as a predetermined number of memory cycles. The predetermined number of memory cycles may in turn be defined as a predetermined number of cycles of a memory clock that is generated on the memory controller side of the interface (and may be a source clock for the data strobe signal). During the predetermined amount of time, ring oscillator 173 may cause counter 175 to increment. Counter 175 may be configured to provide temporary storage of the most recently determined count value. Upon a reset of the counter 175, the count value that was obtained during the predetermined amount of time may be forwarded to memory controller 12, and in particular to ratio logic 315.

After performing a calibration of the data strobe delay, calibration circuit 170 may conduct its own calibration to determine a reference count value that corresponds to the calibrated delay. Upon completion of the calibration procedure by calibration circuit 170, the count value obtained may be forwarded to ratio logic 315 in memory controller 12. Between calibrations of the data strobe delay, calibration circuit 170 may perform its own calibrations to determine the count value that corresponds to a particular number of cycles of the data strobe signal. The resulting count values may then be sent to the memory controller as the current count value. The reference count and the current count value may be used to determine a second scaling factor. For example, a reference count value of 500 and a current count value of 550 indicates a change of 10% (decrease in this case) of the delay as seen at the memory. This scaling factor, as determined in ratio logic, may be used to adjust the delay. Thus, while the MDLL 305 may attempt the maintain the delay at the calibrated value, using the second scaling factor determined by calibration circuit 170 may cause adjustments to the delay, between calibrations thereof, to compensate for changes that occur on the memory side of the interface.

Returning to FIG. 3, a calibration delay value may be provided to both ratio logic 315 and MDLL 305. As noted above, the reference code in MDLL 305 may be set responsive to performing the calibration. The calibration delay value may also be received in ratio logic 305, and may be used in determination of additional codes.

Figure 3:
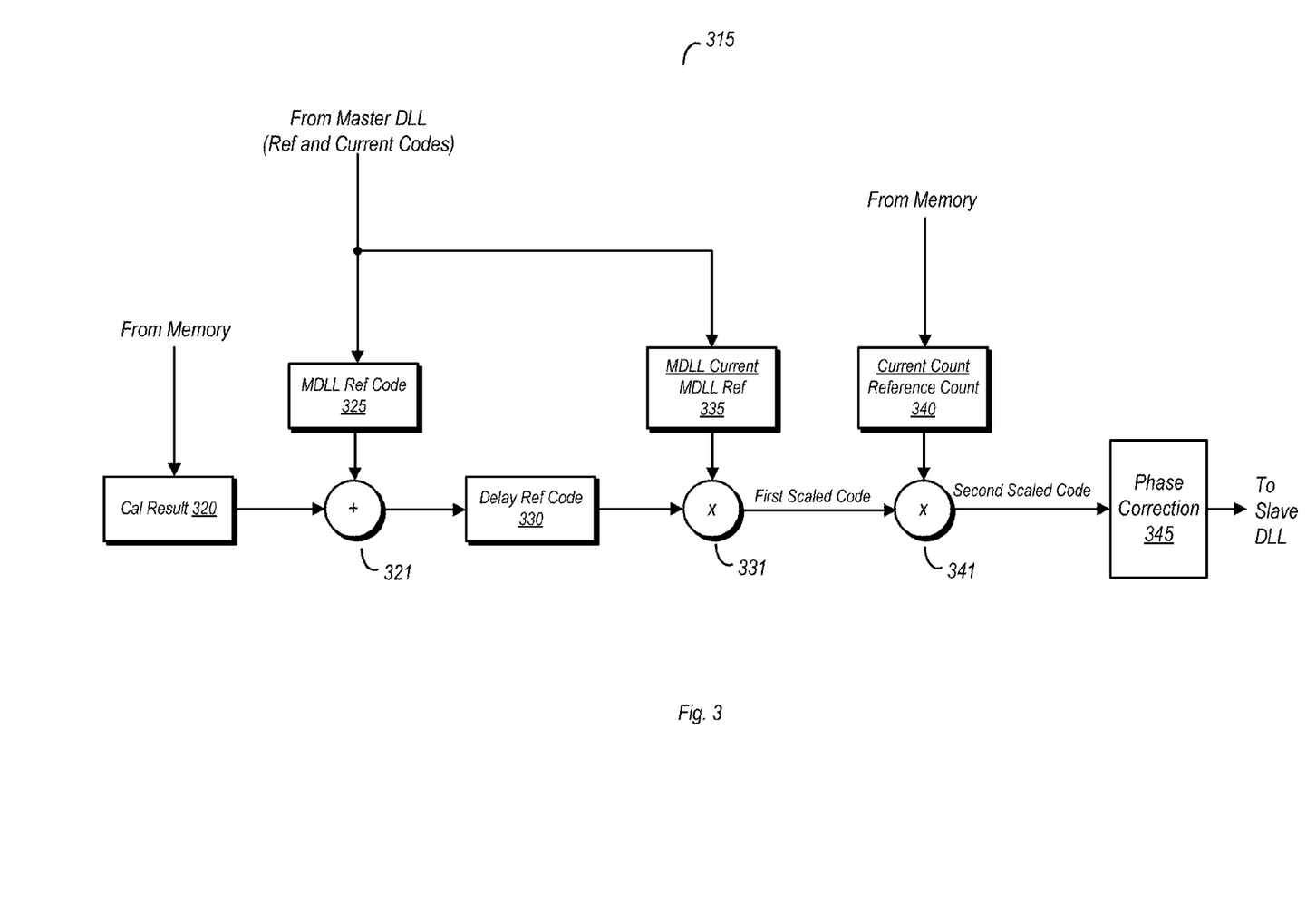
FIG. 3 is a block diagram of one embodiment of a ratio circuit.

Calibrated the delay of the data strobe signal may include performing a number writes of data to and reads of data from memory controller 12 to memory 158. The data obtained from each read may be compared to expected data, with pass/fail determinations made based on the comparisons. A window of passing delay values may be determined. For example, an upper limit of the window may be an upper delay value at which all bits passed. A lower limit of the window may be a lower delay value at which all bits passed. Alternatively, upper and lower limits of the delay window may be determined based on upper and lower limits at which at least one bit passed. Irrespective of the exact methodology used to perform the data strobe delay calibration, a delay value is determined and is used to provide the basis for subsequent calibrations that occur between each instance of the data strobe delay calibrations. Namely, the delay value determined from a data strobe delay calibration is used as a basis for a reference MDLL code and a reference count value, which are used to calculate scaling factors.

Turning now to FIG. 3, a block diagram illustrating one embodiment of ratio logic 315. Ratio logic 315 in the embodiment shown is used to generate a code used to program SDLL 310, which is used to convey the data strobe from memory controller 12 to the memory. Two different scaling factors are generated in this embodiment, the first being based on MDLL codes, and the second being based on count values received from calibration unit 170 on memory 158. As previously noted, MDLL 305 is used in an attempt to maintain the data strobe delay at the calibrated value while adjusting for voltage and temperature changes that may occur in memory controller 12. The reference and current count values provided from calibration unit 170 on memory 158 may be used to cause adjustments to the data strobe delay responsive to changes in delay on the memory side of the interface between data strobe delay calibrations.

Upon performing a data strobe delay calibration, the determined value may be deposited in calibration result register 320. This value may be combined with the MDLL reference code by adder 321, to produce the delay reference code that is then stored in register 330. The MDLL reference code may be deposited in register 325 after MDLL 305 determines the number of delay steps just subsequent to performance of the data strobe delay calibration.

The MDLL reference code is also used in determining the first scaling factor. Subsequent to setting the MDLL reference code, additional self-calibrations of MDLL 305 occur between instances of the data strobe delay calibration. These self-calibrations of MDLL 305 are used to determine a number of delay steps to be applied in order to maintain the data strobe delay value. Each of the self-calibrations may generate a current MDLL code. Divider 305 may be used to divide the current MDLL code by MDLL reference code in order to generate a first scaling factor. The delay reference code stored in register 330 is then multiplied by the first scaling code, thereby generating a first scaled code. The first scaling factor may reflect changes in operating conditions (e.g., voltage, temperature) in memory controller 12 that could affect the delay applied to the data strobe signal.

The second scaling factor may be generated by dividing a current count value by a reference count value. Both of these values may be received from memory 158. The reference count value may be determined upon completing the data strobe delay calibration. In particular, the reference count value may correspond to the data strobe delay determined by the calibration thereof. Subsequent to determining the reference count value, additional calibrations may be performed by calibration circuit 170 to update the count value. The updated count value, referred to as the current count, is forwarded to ratio logic 315 (as is the reference count value upon its determination). The updated count value may be divided by the reference count value, in divider 340, to produce the second scaling factor. Thereafter, the second scaling factor is multiplied by the first scaled code, in multiplier 341, to produce the second scaled code.

SDLL 310 may be programmed based on the second scaled code, although further adjustments are possible in some embodiments. In the embodiment shown, phase correction circuit 345 is configured to adjust the second scaled code in order to cause a phase adjustment to the data strobe signal relative to the write data.

It is noted in the above that the first and second scaling factors are generated based on the MDLL reference code and reference count value, respectively. This is to prevent the accumulation of errors (e.g., quantization error) that might otherwise occur if only the two most recent values for each of the reference code and reference count were used. For example, if only the two most recent values of the MDLL code were used in determining the first scaling factor, any error introduces in the most recent previous MDLL code would be factored into the calculation, along with the current code. Over several iterations, this error could accumulate. Thus, by using the reference MDLL code as the basis for calculating the first scaling factor, only error introduced during the determination of the current MDLL code is factored into the calculation, and thus only the current calculation is affected. Errors that may have been present in previous non-reference values of the MDLL code are not present or factored into any calculation of the first scaling factor using only the reference MDLL code and the current MDLL code. The same applies for calculation of the second scaling factor. Since only the reference count value and the current count value are used to calculate the second scaling factor, only error introduced in determining the current count value is present in the current calculation, but is not present in any subsequent calculation.

The various calibrations discussed above may be performed at various periodicities, or intervals. In one exemplary embodiment, the data strobe delay calibration may be performed every 100 ms, with the reference MDLL code and reference count values also updated at this same interval. The current count value may be determined every 1 ms, or 100 times between calibrations of the data strobe delay. MDLL 305 may perform a self-calibration every 100 μs, thereby updating the MDLL reference code 10 times between updates of the reference count value. It is noted however that these values are exemplary and not intended to be limiting. Generally speaking, updates to the MDLL reference code and the reference count value (as determined by calibration circuit 170 on memory 158) occur more frequently than calibrations of the data strobe delay.

Figure 5:
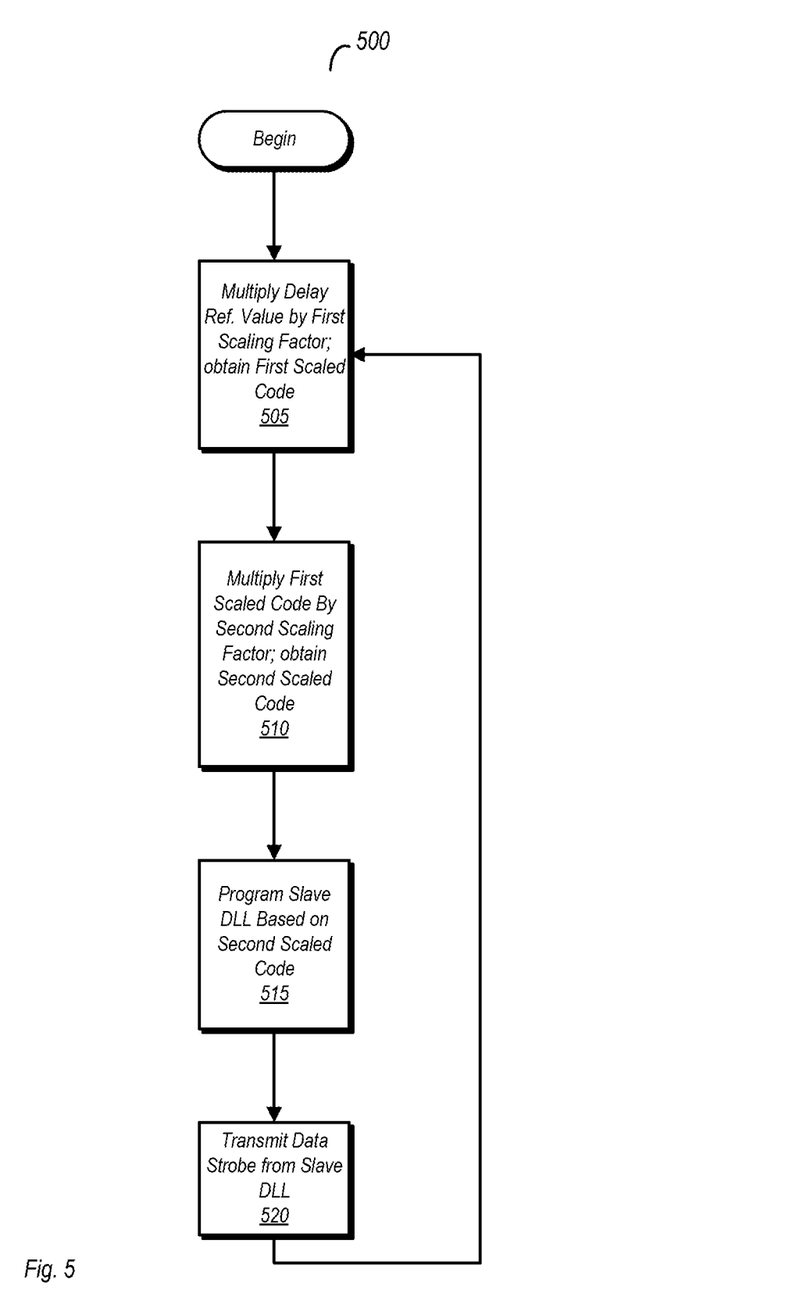
FIG. 5 is a flow diagram illustrating one embodiment of a method for calibrating a data strobe to data responsive to changes in operating conditions between delay calibrations.

Turning now to FIG. 5, a flow diagram illustrating one embodiment of a method for calibrating a data strobe to data responsive to changes in operating conditions between delay calibrations. More particularly, method 500 may be used to update the code of a DLL configured to transmit a data strobe to respond to changing operating conditions in both a memory controller and on the memory itself. Method 500 may be performed using various embodiments of the hardware/circuitry discussed above, although other hardware/circuit embodiments that can perform this methodology are also possible and contemplated.

Method 500 begins with the multiplication of a reference delay value by a first scaling factor to obtain a first scaling code (block 505). Using the hardware embodiments described above, the first scaling factor may be obtained by dividing a current MDLL code by an MDLL reference code. The MDLL reference code may be determined during calibrations to set the delay of the data strobe signal. The current MDLL code may be set by calibrations of the MDLL (e.g., self-calibrations) to determine the number of delay steps to be provided therein.

A second scaling code is obtained by multiplying the first scaled code by a second scaling factor (block 510). In the hardware embodiments described above, the second scaling factor may be obtained by dividing a current count value by a reference count values. Both of these values may be received from a memory, e.g., from a calibration circuit thereon that includes a ring oscillator and a counter. The counter may increment during a predetermined number of cycles of the data strobe signal, with the final count value indicative of a current inherent delay. The reference count value may be determined just after performing a calibration to determine a delay value for the data strobe signal, while the current count value may be determined during intervals between the delay calibrations.

Upon obtaining the second scaled code, an SDLL may be programmed based thereon (block 515). In some embodiments, the code with which the SDLL is programmed may be the second scaled code, while other embodiments, some adjustments (e.g., changes for phase adjustments) may be applied to the second scaled code before programming. In either case, the SDLL may set the final delay value was which the data strobe signal is transmitted, and thus the alignment with data that is also transmitted from the memory controller to the memory. The data strobe signal may then be transmitted at this delay from the SDLL (block 520). Method 500 may then return to block 505.

Figure 6:
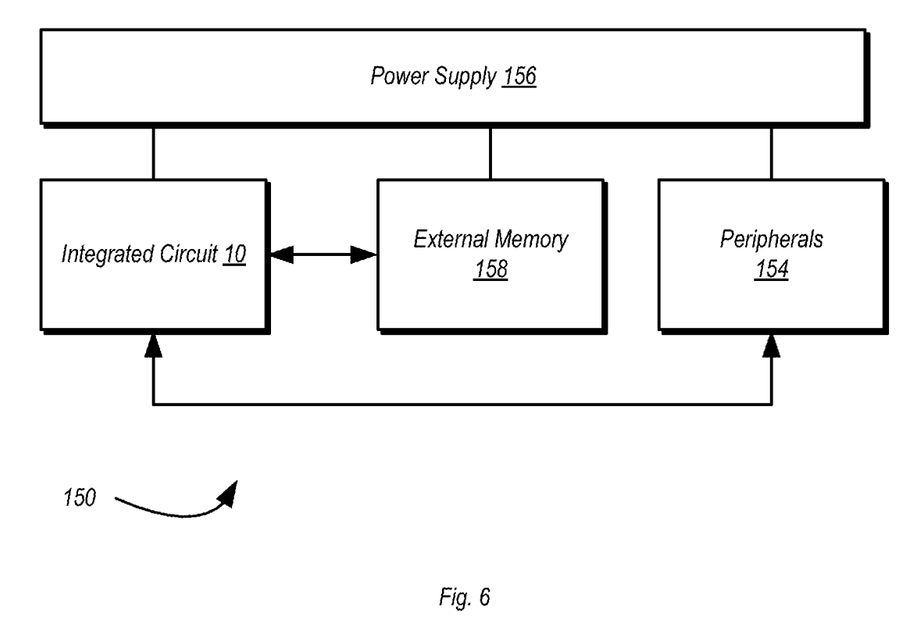
FIG. 6 is a block diagram of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:
1. A method comprising:
multiplying a first scaling factor by a delay reference value corresponding to a delay by a first scaling factor in order to obtain first scaled code, wherein the delay is a calibrated delay of a data strobe signal to be aligned with data signals, wherein the data strobe signal and the data signals are conveyed from a memory controller to a memory;
generating a second scaling factor based on a current count value received from the memory;

multiplying the first scaled code by a second scaling factor in order to obtain a second scaled code, wherein the second scaling factor corresponds to operating conditions on the memory;
programming a first delay locked loop (DLL) in the memory controller based on the second scaled code; and
transmitting the data strobe signal from the first DLL to the memory.

2. The method as recited in claim 1, further comprising generating the second scaling factor using a ring oscillator on the memory.

3. The method as recited in claim 2, wherein generating the second scaling factor comprises:
the ring oscillator incrementing a counter over a predetermined number of memory cycles;
upon completion of the predetermined number of cycles, storing the current count value from the counter into a register; and
calculating the second scaling factor by determining a ratio of the current count value to a reference count, the reference count being based on the delay as determined on the memory.

4. The method as recited in claim 3, wherein the count reference value is determined based on a calibration procedure performed on the memory, and wherein the method further comprises updating the count reference value responsive to performing the calibration procedure.

5. The method as recited in claim 1, further comprising determining a code reference value, wherein the code reference value corresponds to a code for a second DLL in the memory controller that is used to maintain the calibrated delay of the data strobe conveyed to the memory at the delay that corresponds to the first reference value.

6. The method as recited in claim 5, further comprising updating the code reference value responsive to performing the calibration procedure, wherein the calibration procedure is used to determine an amount of the delay.

7. The method as recited in claim 5, further comprising determining the first scaling factor by dividing a current code for the second DLL by the second reference value.

8. The method as recited in claim 1, further comprising updating the first reference value at a first periodicity, updating the second scaling factor at a second periodicity less than the first periodicity, and updating the first scaling factor at a periodicity less than the second periodicity.

9. An apparatus comprising:
a first register configured to store a reference delay value corresponding to a calibrated delay applied to a data strobe signal transmitted from a memory controller to a memory;
a first divider configured to divide a current code for a first delay locked loop (DLL) by a first reference code to produce a first scaling factor;
a first multiplier configured to multiply the reference delay value by the first scaling factor to generate a first scaled code;
a second divider configured to divide a current count value by a reference count value to produce a second scaling factor;
a second multiplier configured to multiply the second scaling factor by the first scaled code in order to generate a second scaled code; and
a second DLL, wherein the second DLL is programmed according to the second scaled code, and wherein the second DLL is configured to convey the data strobe signal to the memory.

10. The apparatus as recited in claim 9, wherein the memory controller is configured to receive the current count value and the reference count value from the memory.

11. The apparatus as recited in claim 10, wherein the memory includes a ring oscillator and a counter, wherein the ring oscillator is configured to cause the counter to increment, wherein the current count value is a count value reached by the counter upon completion of a predetermined number of memory cycles.

12. The apparatus as recited in claim 11, wherein responsive to performing a calibration procedure, the memory is configured to convey the reference count value to the memory controller, wherein the reference count value is a first count value reached by the counter upon completion of the predetermined number memory cycles after completing the calibration procedure.

13. The apparatus as recited in claim 12, wherein the memory controller is configured to update the reference code responsive to completion of the calibration procedure.

14. The apparatus as recited in claim 9, wherein the first reference code is a code for programming the first DLL to cause the data strobe signal to be conveyed to the memory controller at the calibrated delay.

15. The apparatus as recited in claim 9, wherein the first divider is configure to divide the current code by the reference code responsive to performance of a calibration of the first DLL.

16. The apparatus as recited in claim 9, wherein the first divider is configured to calculate the first scaled code at a first periodicity, and wherein the second divider is configured to calculate the second scaled code at a second periodicity, wherein the second periodicity is greater than the first periodicity.

17. The apparatus as recited in 16, wherein the memory controller is configured to cause a calibration procedure to be performed to determine the calibrated delay at a third periodicity, wherein the third periodicity is greater than the first periodicity and the second periodicity.

18. A system comprising:
a memory having a plurality of storage locations;
a memory controller coupled to write data to the memory, wherein the memory controller is configured to convey a plurality of data signals and a data strobe signal to the memory, wherein the memory controller includes master and slave delay locked loops (DLLs) configured to control a delay of the data strobe signal, and wherein the memory controller further includes:
a first divider configured to generate a first scaling factor by dividing a current DLL code for the master DLL by a reference DLL code;
a first multiplier configured to multiply the first scaling factor by a reference delay value to produce a first scaled code;
a second divider configured to divide a current count value by a reference count value to produce a second scaling factor, wherein the current count and reference count values are received form the memory;
a second multiplier configured to multiply the second scaling factor by the first scaled code in order to generate a second scaled code, wherein the slave DLL is programmed based on the second scaled code, and wherein the slave DLL is configured to convey the data strobe signal to the memory.

19. The system as recited in claim 18, wherein the memory includes:
a ring oscillator; and a counter, wherein the ring oscillator is configured to cause the counter to increment, wherein the current count value is a count value reached by the counter upon completion of a predetermined number of memory cycles;

wherein responsive to performing a calibration procedure, the memory is configured to convey the reference count value to the memory controller, wherein the reference count value is a first count value reached by the counter upon completion of the predetermined number memory cycles after completing the calibration procedure.

20. The system as recited in claim 18, wherein the memory controller is configured to perform a data strobe calibration procedure in order to calibrate a delay of the data strobe signal, wherein the reference DLL code is updated responsive to performing the data strobe calibration procedure, and wherein between instances of performing the data strobe calibration procedure, the master DLL is configured to perform a DLL self-calibration procedure, wherein the current DLL code is updated responsive to performing the DLL self-calibration procedure.

* * * * *